United States Patent [19]

Davis et al.

[11] Patent Number: 5,260,955
[45] Date of Patent: Nov. 9, 1993

[54] AUTOMATICALLY SETTING A THRESHOLD CURRENT FOR A LASER DIODE

[75] Inventors: James G. Davis; Sreeram Dhurjaty, both of Rochester, N.Y.

[73] Assignee: Eastman Kodak Company, Rochester, N.Y.

[21] Appl. No.: 812,509

[22] Filed: Dec. 20, 1991

[51] Int. Cl.$^5$ ................................. H01S 3/10
[52] U.S. Cl. ..................................... 372/31
[58] Field of Search ........................ 372/29, 31

[56] References Cited

U.S. PATENT DOCUMENTS

| | | |
|---|---|---|
| 4,009,385 | 2/1977 | Sell ........................ 250/199 |
| 4,611,352 | 9/1986 | Fujito et al. ............... 455/609 |
| 4,618,958 | 10/1986 | Shibata et al. ............. 372/29 |
| 4,663,760 | 5/1987 | Shimada et al. ............ 372/31 |
| 4,733,398 | 3/1988 | Shibagaki et al. .......... 372/31 |
| 4,763,334 | 8/1988 | Shimada et al. ............ 372/29 |
| 4,796,266 | 1/1989 | Banwell et al. ............ 372/38 |
| 4,853,934 | 8/1989 | Sakurai .................... 372/29 |
| 4,856,011 | 8/1989 | Shimada et al. ............ 372/38 |
| 4,876,442 | 10/1989 | Fukushima ................ 250/205 |
| 4,890,288 | 12/1989 | Inuyama et al. ........... 372/31 |
| 4,907,236 | 3/1990 | Shimada .................... 372/31 |
| 4,918,681 | 4/1990 | Ikeda ....................... 369/116 |
| 4,995,045 | 2/1991 | Burley et al. ............. 372/38 |
| 5,081,631 | 1/1992 | Dhurjaty .................. 372/38 |

Primary Examiner—James W. Davie
Attorney, Agent, or Firm—William F. Noval

[57] ABSTRACT

A technique for automatically setting a threshold current for a laser diode which has a linear laser operating region and a lower non-linear operating region. The laser diode is controlled (1) during a warm-up period during which no operating current is supplied to the laser diode, to allow the electronics and laser diode to stabilize; (2) during an initialization period, during which the current through the laser diode is brought up to a threshold operating point above said non-linear operating region and during which no image data is applied to the laser diode; and (3) during an operating period in which digital image data is applied to the laser diode to operate it in the linear laser operating region.

5 Claims, 3 Drawing Sheets

AUTOMATICALLY SETTING A THRESHOLD CURRENT FOR A LASER DIODE

TECHNICAL FIELD

The present invention relates to laser diodes and more particularly to a technique for automatically setting a threshold current for a laser diode used in radiographic laser printing systems.

BACKGROUND OF THE INVENTION

The laser diode has been used frequently as a light source in a variety of photographic applications. For example, in the field of laser printing, a laser beam is focused through a lens and then scanned onto a photosensitive medium, such as film. The diode is often controlled by digital data stored in a computer. Image quality may be improved by forming an image from pixels having varying gray tones to form a continuous tone image in film. The continuous tone radiographic laser printer is one application in which a laser diode is used to expose radiographic film to electronic images produced by medical imaging modalities, such as computed tomography, magnetic resonance imaging, digital subtraction angiography, ultrasonic imaging, and the like.

A problem with laser diodes is that the illuminative output of a semiconductor laser diode is not linear across its entire operating range. More specifically, as shown in FIG. 1 (which is a typical graph of light output of a laser diode as a function of current), the resulting curve has a lower level non-linear operating region joined by a knee region to a higher level operating region where light output varies linearly as a function of input signal value. The linear region is called the lasing region and the non-linear lower level region is known as the light emitting or spontaneous emission region. The curve includes a lower portion between 0 and the knee current $I_k$ where the resulting optical power output $P_d$ varies in a non-linear manner as current $I_d$ changes and a second higher portion between $I_k$ and $I_{max}$ where optical power output varies linearly with changes in current $I_d$. Because the non-linear region is unsatisfactory for generating a continuous tone image in response to image input signal levels, it is desirable that the laser output range be limited to the linear operating region. It is thus common practice to operate a laser diode at or above a predetermined current level called a threshold current. Problems arise, however, from attempting to bring the laser diode to threshold current concurrent with powering up the electronics, because the current drive circuits for the laser diode are generally unstable until power stabilizes and electrical glitches or over current conditions for the laser diode can result. Other problems arise from the fact that over the lifetime of the laser, more current is required to reach the same threshold illuminative output power, so that a system which applies the same threshold current to the laser diode over the life of the laser diode will be inadequate.

The following U.S. Pat. Nos. disclose laser diode control circuits which have not been entirely successful in solving these problems. U.S. Pat. No. 4,618,958 issued Oct. 21, 1986, inventors Shibata et al.; U.S. Pat. No. 4,663,760 issued May 5, 1987, inventors Shimada et al.; U.S. Pat. No. 4,763,334 issued Aug. 9, 1988, inventors Shimada et al.; U.S. Pat. No. 4,853,934, issued Aug. 1, 1989, inventor Sakurai; U.S. Pat. No. 4,856,011, issued Aug. 8, 1989, inventor Shimada et al.; U.S. Pat. No. 4,907,236, issued Mar. 6, 1990, inventor Shimada; U.S. Pat. 4,009,385, issued Feb. 22, 1977, inventor Sell; U.S. Pat. No. 4,876,442, issued Oct. 24, 1989, inventor Fukushima; U.S. Pat. No. 4,611,352, issued Sep. 9, 1986, inventors Fujito et al.; U.S. Pat. No. 4,995,045, issued Feb. 19, 1991, inventors Burley et al.; U.S. Pat. No. 4,733,398, issued Mar. 22, 1988, inventors Shivagaki et al.; U.S. Pat. No. 4,796,266, issued Jan. 3, 1989, inventors Banwell et al.; U.S. Pat. No. 4,918,681, issued Apr. 17, 1990, inventor Ikeda; and U.S. Pat. No. 4,890,288, issued Dec. 26, 1989, inventors Inuyama et al.

SUMMARY OF THE INVENTION

According to the present invention, there is provided a technique for automatically setting a threshold current for a laser diode in order to allow the electronics which control the illuminative output of a laser diode to initially bring the laser diode up with no current through it and, as a result, no output illumination. After allowing power supplies for the electronic circuitry, the electronics and the temperature of the laser diode to stabilize, the threshold circuit is employed to bring the current through the laser diode to a level which corresponds to a preset illuminative output.

According to another aspect of the present invention, when the laser diode is first turned on, it goes through a preliminary warm-up period, a threshold current initialization period and an operating period. During the warm-up period, the laser diode has no current passing through it. During the initialization period, the current passing through the laser diode is increased to reach a threshold current which operates the laser diode at a predetermined illuminative threshold output. After the threshold point is reached, the initialization circuit is disabled and the laser output illuminative power is operated from the preset threshold power to the maximum illuminative output power. After the initialization period, when the initialization circuit is disabled, the current required to place the laser diode at threshold is maintained by the initialization circuit. A photo diode receives illumination from the laser diode and is used in a first mode during the initialization period to provide a feedback to bring the laser diode up to the preset threshold laser output power and in the normal laser operating mode to provide a feedback. The photo diode is used in all modes to stabilize the power output over variations in laser slope efficiency and threshold current due to device to device differences, degradation over time and temperature sensitivity.

BRIEF DESCRIPTION OF THE DRAWINGS

In a detailed description of the preferred embodiments of the invention presented below, reference is made to the accompanying drawings in which like numerals refer to like elements.

DETAILED DESCRIPTION OF THE PREFERRED EMBODIMENTS

Figure 1:
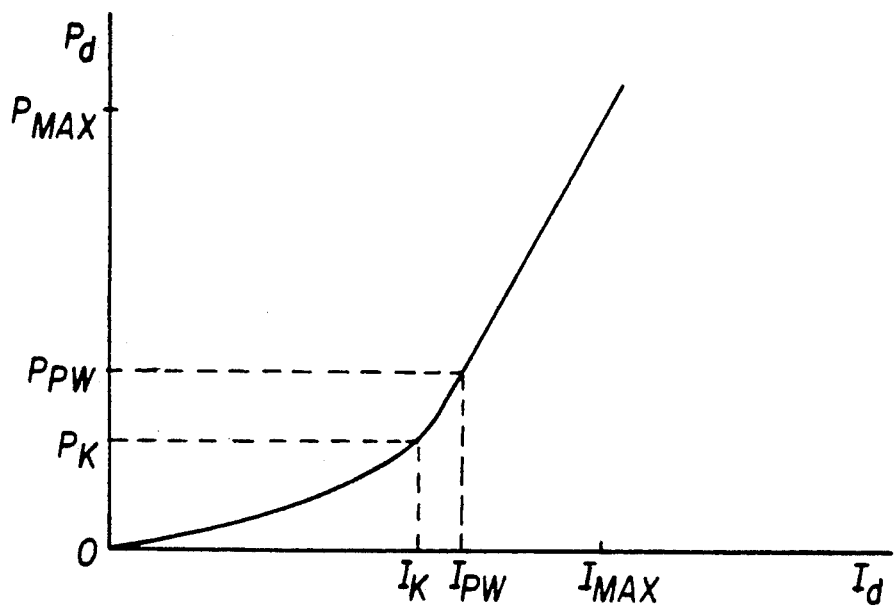
FIG. 1 is a graph of a laser diode operating curve in which illuminative output power P is a function of current I through the diode.
Figure 2:
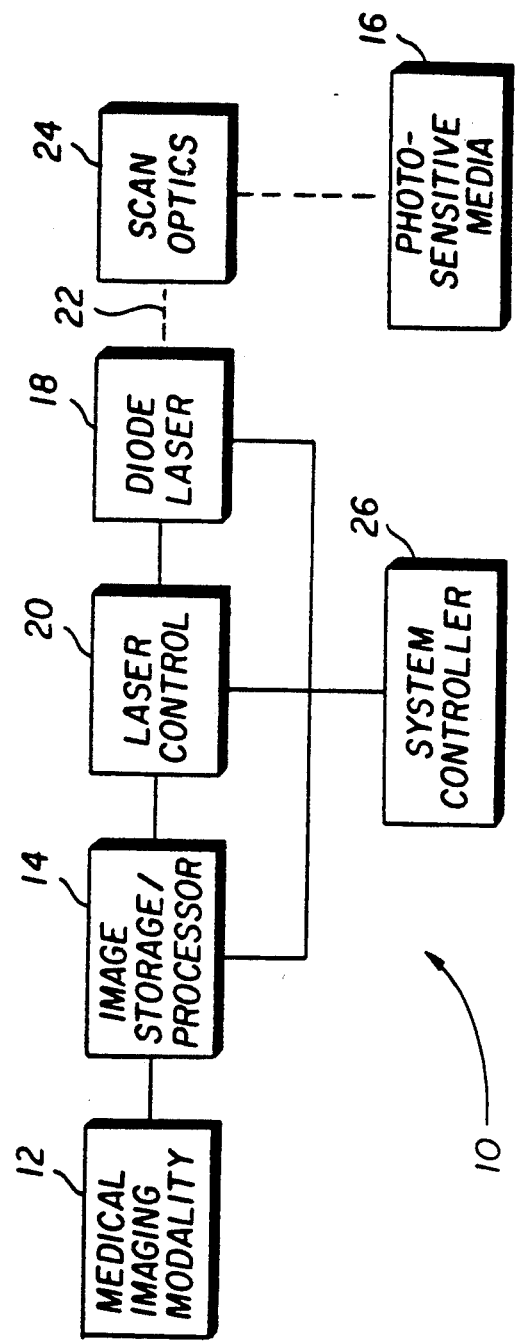
FIG. 2 is a simplified block diagram of an imaging system incorporating a laser diode and an embodiment of the controlled circuitry of the present invention.

Referring now to FIG. 2, there is shown a medical imaging system incorporating an embodiment of the present invention. As shown, system 10 includes a source of a digital medical diagnostic image such as is produced by medical imaging modality 12. Modality 12 may, for example, be a diagnostic imaging modality such as computed tomography, magnetic resonance imaging, ultrasound, digital subtraction angiography, nuclear medicine, or the like. The digital image can also be produced from a storage phosphor, a digitized radiograph or from a digital image archive or storage system. The image produced by modality 12 is digitized and stored in image storage processor 14. The digital image may be stored in a magnetic or optical disk drive provided in processor 14. The digital image may also be processed by well-known techniques, such as window width-level tonal gradation, interpolation, edge enhancement, or the like.

A hard copy of the digital image is produced on photosensitive media 16 by means of a laser diode 18 which is controlled by laser control circuit 20 according to the present invention. The laser beam 22 produced by diode laser 18 is shaped and scanned by means of scan optics 24 to produce a visible image of the digital image on photosensitive media 16 which may, for example, be film, paper or the like.

System 10 includes system controller 26, such as a microprocessor which controls processor 14, laser control circuit 20, diode laser 18, and scan optics 24.

Figure 3:
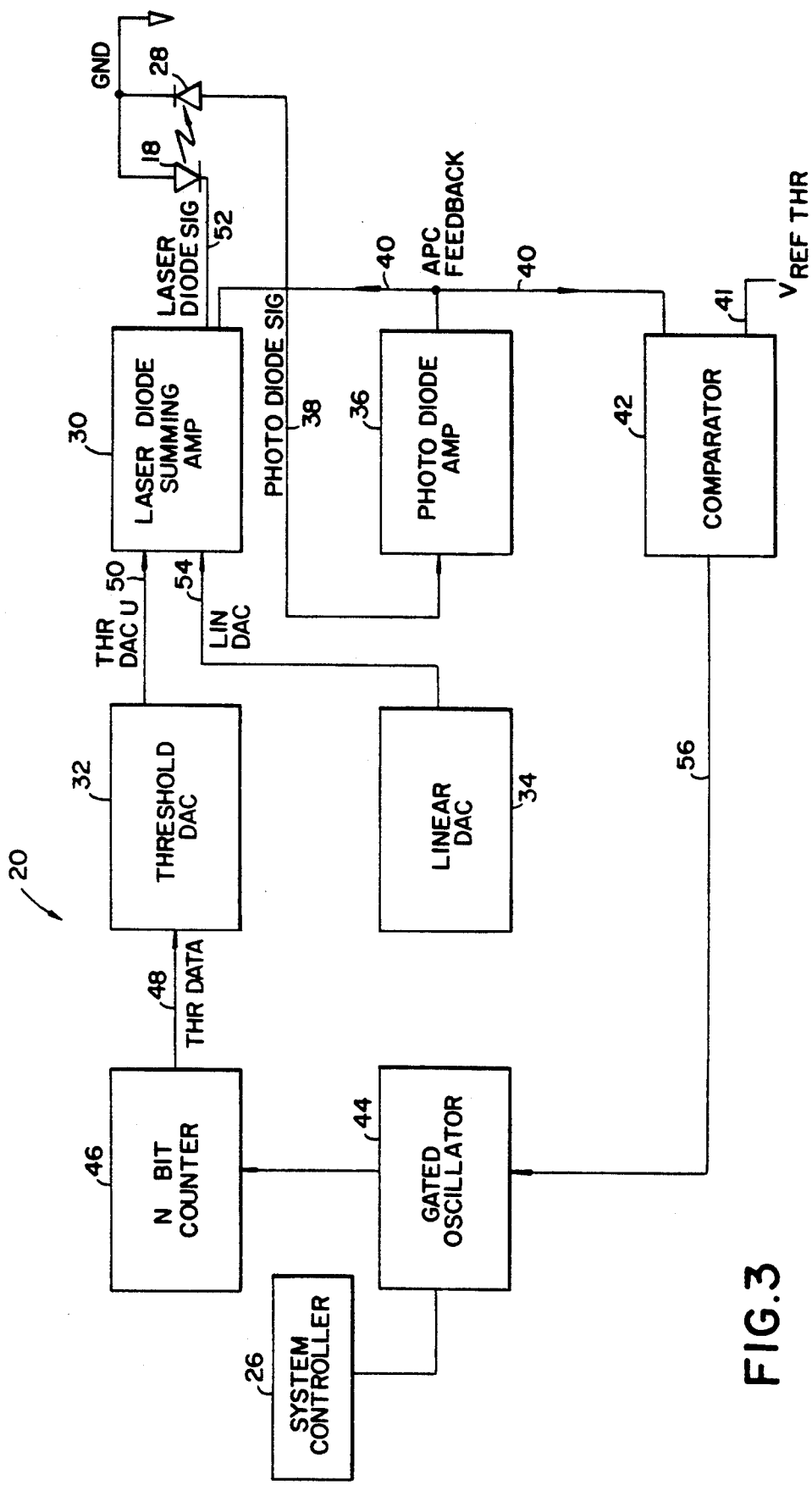
FIG. 3 is a block diagram of the embodiment of the invention shown in FIG. 2.

Referring now to FIG. 3, there is shown an embodiment of the present invention for effecting auto thresholding of laser diode 18 and operation of laser diode 18 from the illuminative output threshold value to a maximum illuminative output. As shown, laser diode 18 is driven by a laser diode summing amplifier 30 which is a transconductance amplifier (i.e., which converts voltage inputs to current outputs) which sums the inputs from a threshold digital to analog converter (DAC) 32, a linear DAC 34 and a photo diode amplifier 36.

The laser diode illuminative power is monitored by a photodiode (PD) 28 which may be a back facet photo diode or an external photo diode. Photo diode amplifier 36, which is a transimpedance amplifier (i.e., converts current to voltage), uses input current signal 38 to generate a negative feedback voltage signal 40 which is used as an input to laser diode summing amplifier 30 during both its initialization and operating modes. This negative feedback signal 40 is the means of stabilizing the variation of illuminative output power from laser diode 18 due to changes in laser diode temperature and parameter variations such as degradation of the slope efficiencies of laser diode 18 with aging and device to device differences. This type of negative feedback is usually referred to as an automatic power control, or APC circuit. APC feedback signal 40 is also applied to voltage comparator 42 where it is used to determine if the laser diode 18 illuminative output power is either below or at a preset threshold. APC feedback signal 40 is compared to a voltage reference threshold signal 41 ($V_{REFTHR}$). When comparator 42 determines that laser diode 18 is producing the preset illuminative output threshold power, a logic signal 56 is asserted and used to turn off gated oscillator 44.

Gated oscillator 44, when enabled during the laser diode initialization period, clocks a n bit counter 46 which then increments its output count through threshold data signal 48 which in turn increments the threshold digital-to-analog converter (DAC) 32. Analog output voltage signal 50 is applied to summing amplifier 30 to increase the current output 52 of amplifier 30 to laser diode 18.

Normal operation of circuit 20 disables gated oscillator 44 by means of a signal from control system computer 26 during the warm-up period and oscillator 44 remains disabled until enabled after a time delay for stabilization. Control system computer 26 then enables gated oscillator 44 to increment n bit counter 46 which then increments output count 48, which in turn increments the threshold signal 50 produced by DAC 32. Signal 50 is applied to the summing amplifier 30 to increase the current output signal 52 through laser diode 18. The initialization period continues until comparator 42 determines that laser diode 18 is at the preset threshold illuminative output. At such time, logic signal 56 is deasserted which disables gated oscillator 44 at the end of the initialization period.

The next mode of operation is the operating mode of laser diode 18 in which linear DAC 34 controls the laser diode 18 output illuminative power from the preset threshold output illuminative power to the maximum illuminative output power. The output of linear DAC 34 is a voltage signal 54 which is applied to summing amplifier 30.

Summarizing amplifier 30 also has filtering which de-glitches the output of threshold DAC 32 and linear DAC 34.

INDUSTRIAL APPLICABILITY

The present invention finds industrial application in laser diode imaging systems such as radiography laser printers and other forms of continuous tone or document laser printers.

The invention has been described in detail with particular reference to certain preferred embodiments thereof, but it will be understood that variations and modifications can be effected within the spirit and scope of the invention.

We claim:

1. A laser diode system comprising:
   a laser diode having a linear laser operating region extending continuously between a minimum threshold operating point to a maximum illuminative output point and a lower non-linear operating region;
   amplifier means for supplying operating current to said laser diode; and
   control means for controlling said amplifier means and said laser diode such that said laser diode is operated, during a warm-up period during which no operating current is supplied to said laser diode by said amplifier means, during an initialization period during which said amplifier means supplies current to said laser diode to bring said laser diode to said minimum threshold operating point above said non-linear operating region and during which no image data is applied to said laser diode, and during an operating period in which digital image information is applied to said amplifier means to operate said laser diode in said linear laser operating region from said minimum threshold operating point up to said maximum illuminative output point wherein said control means includes feedback means for producing a feedback signal which is a function of an operating parameter of said laser diode, which is used during said initialization period of said laser diode to effect an increase of current from said amplifier means through said laser diode until said laser is operated at said minimum threshold operating point and which is applied to said amplifier means during said operating period to stabilize the variation of output illuminative power of said laser diode with changes in laser temperature and laser operating parameters.

2. The system of claim 1 wherein said feedback means includes a photo diode positioned to receive illuminative output from said laser diode and providing a feedback signal, which is used during said initialization period of said laser diode to effect increase of current from said amplifier means through said laser diode until said laser diode is operating at said predetermined threshold illuminative power output, and which is applied to said diode amplifier means during said operating period to effect a negative feedback signal which stabilizes the variation of output illuminative power of said laser diode with changes in laser temperature and parameters.

3. The laser diode system of claim 2 wherein said control circuit includes a comparator for receiving the feedback signal from said photo diode and comparing it to a reference threshold signal, a gated oscillator connected to said comparator, an n bit counter connected to said gated oscillator, a threshold digital-to-analog converter connected between said counter and said laser diode amplifier means, whereby (a) during said initialization period, said feedback signal from said photo diode is less than said reference threshold signal, and said comparator enables said gated oscillator to increment said n bit counter to produce a digital signal which is converted by said threshold digital-to-analog converter to a threshold analog voltage signal, which is applied to said laser diode amplifier means to increase the threshold current to said laser diode, and (b) when said feedback signal from said photo diode is equal to said reference threshold signal, thus indicating that said laser diode is operating on said threshold illuminative output power, said comparator disables said gated oscillator so that said threshold digital-to-analog converter applies a fixed threshold voltage to said amplifier means during said laser diode operating period.

4. The laser diode system of claim 3 including a linear digital-to-analog converter for receiving a digital image signal and for converting said signal into an analog voltage signal which is applied to said laser diode amplifier means during said operating period to effect operation of said laser diode in said linear operating region.

5. The laser diode system of claim 4 wherein said amplifier means includes a filtering circuit which de-glitches the output of said threshold digital-to-analog converter and said linear digital-to-analog converter.

* * * * *